(12) United States Patent
Veino et al.

(10) Patent No.: US 10,375,852 B2
(45) Date of Patent: Aug. 6, 2019

(54) AIRFLOW BAFFLE SYSTEM

(71) Applicants: Clint Veino, Hampstead, NH (US); Bruce Long, Corrales, NM (US); Lars Strong, Santa Fe, NM (US)

(72) Inventors: Clint Veino, Hampstead, NH (US); Bruce Long, Corrales, NM (US); Lars Strong, Santa Fe, NM (US)

(73) Assignee: Aquila, Inc., Albuquerque, NM (US)

( * ) Notice: Subject to any disclaimer, the term of this patent is extended or adjusted under 35 U.S.C. 154(b) by 462 days.

(21) Appl. No.: 14/688,652

(22) Filed: Apr. 16, 2015

(65) Prior Publication Data
US 2015/0296657 A1 Oct. 15, 2015

Related U.S. Application Data

(63) Continuation of application No. PCT/US2015/024202, filed on Apr. 3, 2015.
(Continued)

(51) Int. Cl.
*H05K 7/20* (2006.01)

(52) U.S. Cl.
CPC ..... *H05K 7/20145* (2013.01); *H05K 7/20745* (2013.01)

(58) Field of Classification Search
CPC ........ G06F 1/20; H05K 7/20; H05K 7/20745; H05K 7/20145; H05K 7/20536; H05K 7/20618; H05K 7/20709; H05K 7/20718
(Continued)

(56) References Cited

U.S. PATENT DOCUMENTS

| 4,371,026 A | 2/1983 | Miller et al. |
| 5,056,969 A | 10/1991 | Nerland et al. |

(Continued)

FOREIGN PATENT DOCUMENTS

| JP | 2004041676 A | 2/2004 |
| JP | 2004184070 A | 7/2004 |

(Continued)

OTHER PUBLICATIONS

International Search Report and Written Opinion Application. No. US 2015 024202 Completed: Jun. 15, 2015; dated Jul. 6, 2015 9 pages.

*Primary Examiner* — Vivek K Shirsat
*Assistant Examiner* — Ryan L Faulkner
(74) *Attorney, Agent, or Firm* — St. Onge Steward Johnston & Reens LLC

(57) ABSTRACT

An airflow baffle system has an airflow baffle with a base and an airflow diverter panel. A mounting arm is connected to the base. A magnet connected to the mounting arm is operable to magnetically connect to the top of the equipment cabinet. The mounting arm is selectively pivotal in a horizontal plane relative to the base and fixable in a plurality of angular orientations. A position of the magnet is adjustable along a length of the mounting arm and the magnet is connected to the mounting arm by a flexible connection permitting the magnet to pivot about horizontal axes relative to the mounting arm. The airflow diverter panel is mountable on the base in an angled orientation and a vertical orientation. A unitary or separable riser allows adjustment of a vertical position of the airflow diverter panel with respect to the top of the equipment cabinet.

20 Claims, 14 Drawing Sheets

Related U.S. Application Data

(60) Provisional application No. 61/974,773, filed on Apr. 3, 2014.

(58) Field of Classification Search
USPC .......................................................... 454/184
See application file for complete search history.

(56) References Cited

U.S. PATENT DOCUMENTS

| | | |
|---|---|---|
| 7,259,963 B2 | 8/2007 | Germagian et al. |
| 7,841,199 B2 | 11/2010 | VanGilder et al. |
| 7,922,402 B2 | 4/2011 | Gaertner et al. |
| 8,156,753 B2 | 4/2012 | VanGilder et al. |
| 2008/0285232 A1 | 11/2008 | Claassen et al. |
| 2011/0271610 A1 | 11/2011 | Cottuli |
| 2011/0304519 A1 | 12/2011 | Klein |
| 2012/0049013 A1 | 3/2012 | Klein |
| 2012/0083197 A1 | 4/2012 | Rodriguez |
| 2012/0112612 A1* | 5/2012 | Krietzman ......... H05K 7/20745 312/236 |

FOREIGN PATENT DOCUMENTS

| | | |
|---|---|---|
| JP | 3159755 U | 5/2010 |
| JP | 2012182163 A | 9/2012 |

\* cited by examiner

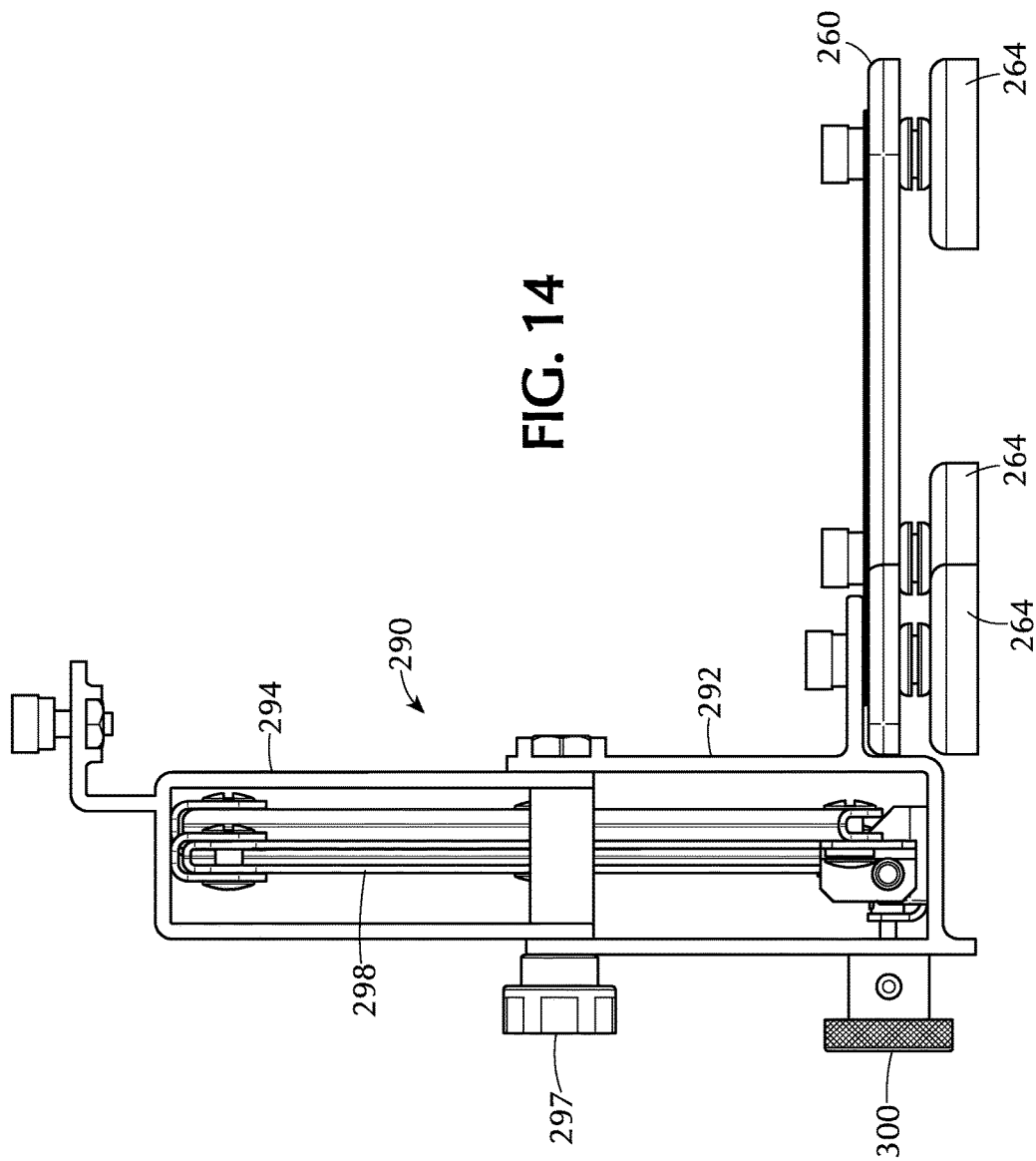

AIRFLOW BAFFLE SYSTEM

FIELD OF THE INVENTION

The present invention relates airflow management devices and, in particular, to an airflow baffle system for data centers and other uses.

BACKGROUND OF THE INVENTION

Modern data centers house large numbers of computer servers, typically housed in rows of server cabinets, in which a plurality of servers are mounted in a closely spaced relation within the cabinets. In operation, the densely arranged servers generate substantial heat, which must be removed in order to prevent overheating and malfunction of the equipment. The individual server units generally are provided with internal fans, which pull cooling air through the unit. However, because of the high density of the equipment, it is customary to provide substantial air conditioning systems to supply cooled air to the fronts of the cabinets, available to be drawn through the individual servers by their internal fans.

Operating efficiency of the cooling systems has become an increasing problem as the power output of the servers has been progressively increased and the expense of cooling them has become very meaningful. A significant aspect of controlling cooling costs is the prevention or minimization of mixing of the cooled air at the front of the cabinet, with warm air in the data center. Where mixing is allowed to occur outside of the servers, the capacity of the A/C equipment must be enlarged, at increased capital expense. In addition the efficiency of the A/C equipment is compromised due to the lower temperature differential between the air returned to the A/C equipment.

Among the techniques employed at modern data centers to improve efficiency is arranging rows of server cabinets in hot- and cold-air aisles. Typically, two rows of server cabinets are oriented back-to-back, with cool air being supplied to the fronts of the rows (forming cold aisles) and warm air being collected in the hot aisle between the two rows, which is then returned to the A/C unit. This technique represents an improvement over previous arrangements but still permits considerable quantities of the cool air to bypass the servers and mix with warm air.

Other techniques employed in modern data centers are complete air containment (i.e., complete enclosure) and partial air containment. Complete air containment involves completely closing off an aisle, for example a cold-air aisle, between rows of server cabinets. In complete air containment, roof baffles are connected between the top portions of adjacent rows of server cabinets, to create an upper barrier, and doors (or walls) are connected between side potions of the cabinets at the ends of adjacent rows, to create side barriers. The floor of the server room and the cabinets provide the remaining sides of the complete enclosure. In a cold-air aisle, for example, perforations in the floor panels allow air to flow into the enclosed cold-air aisle and then to the servers.

In partial air containment systems, the system does not completely enclose the area between adjacent rows of cabinets. The purpose and intention of partial air containment systems is to inhibit undesirable airflow, but at the same time provide benefits of an open aisle configuration.

SUMMARY OF THE INVENTION

The airflow baffle system of the invention provides a tool-less, modular and reusable air containment system designed, and particular suitable for, modern data centers. The system is highly configurable and effectively isolates hot and cold air mixing between adjacent hot- and cold-air aisles in an efficient and cost-effective manner.

The airflow baffle system is suitable to manage airflow within an aisle formed by adjacent rows of closely-spaced equipment cabinets, and other uses. The airflow baffle system includes an airflow baffle having a base and an airflow diverter panel. The base is operable to removably mount to a top of an equipment cabinet and has a contact portion operable to contact the top of the equipment cabinet adjacent an aisle-facing edge of the equipment cabinet. The airflow diverter panel is supported by and extending upwardly from the base. At least one mounting arm is connected to the base, and a magnet is connected to and depends downwardly from the mounting arm. The magnet is operable to magnetically connect to the top of the equipment cabinet spaced from of the contact portion of the base.

The mounting arm can be connectable to the base in a plurality of positions along a width of the base, whereby the mounting arm can be located in a plurality of positions along a width of the equipment cabinet.

The base can have a plurality of mounting holes along the width of the base and the mounting arm is connectable to the base in any of the mounting holes.

The mounting arm can be connected to the base by an adjustable fastener, and by operation of the adjustable fastener the mounting arm is selectively pivotal in a horizontal plane relative to the base and fixable in a plurality of angular orientations in the horizontal plane.

The magnet can be connected to the mounting arm by a flexible connection permitting the magnet to pivot about horizontal axes relative to the mounting arm. A resiliently compressible grommet is disposed between the magnet and the mounting arm and the grommet is operable to permit the magnet to pivot about any horizontal axis relative to the mounting arm. The magnet is selectively fixable to the mounting arm in a plurality of locations along a length of mounting arm.

The mounting arm can have a slot along the length thereof and the magnet is connected to the mounting arm by an adjustable fastener directed through the slot. By operation of the adjustable fastener the magnet is selectively movable and fixable to the mounting arm in any position along the slot.

The airflow diverter panel can have an upper portion operable to influence airflow and a lower portion operable to mount the airflow diverter panel to the base. The airflow diverter panel is removably mountable on the base in at least first and second positions. In the first position of the airflow diverter panel, the upper portion is in a first angular orientation relative to a horizontal plane; and in the second position of the airflow diverter panel, the upper portion is in a second angular orientation relative to the horizontal plane which is more vertical than the first angular orientation. The second angular orientation can be substantially vertical.

The base can have an upwardly-open channel along a width sized and shaped to receive and support the lower portion of the panel. The channel is aligned at a first angle with respect to a vertical direction and the lower portion of the panel is aligned at a second angle with respect to the upper portion of the panel, and a sum of the first and second angles being substantially one-hundred and eighty degrees.

The base can have an adjustable riser operable to adjust a vertical position of the airflow diverter panel with respect to the top of the equipment cabinet. The riser can have an upper portion and a lower portion, with the lower portion operable to connect to the top of the equipment cabinet and the lower portion having the contact portion of the base, and the mounting arm and magnet are connected to the lower portion. The upper portion is selectively movable in a vertical direction relative to the lower portion and fixable relative to the lower portion to adjust a vertical position of the airflow diverter panel with respect to the top of the equipment cabinet.

The base can have a fixed-height portion and the riser can be separable from the fixed-height portion of the base. The mounting arm and magnet are selectively connectable to the fixed-height portion of the base or to the riser. The airflow baffle can have means to move the upper portion of the riser relative to the lower portion and means to fix the upper portion of the riser relative to the lower portion.

A plurality of equipment cabinets arranged in a row in a data center and an airflow baffle as described above can be mounted on each of the plurality of equipment cabinets an forming a substantially continuous airflow barrier along an length of the row.

BRIEF DESCRIPTION OF THE DRAWINGS

FIG. 14 is a side elevation view of the riser of FIG. 13.

DETAILED DESCRIPTION OF THE INVENTION

Figure 1:
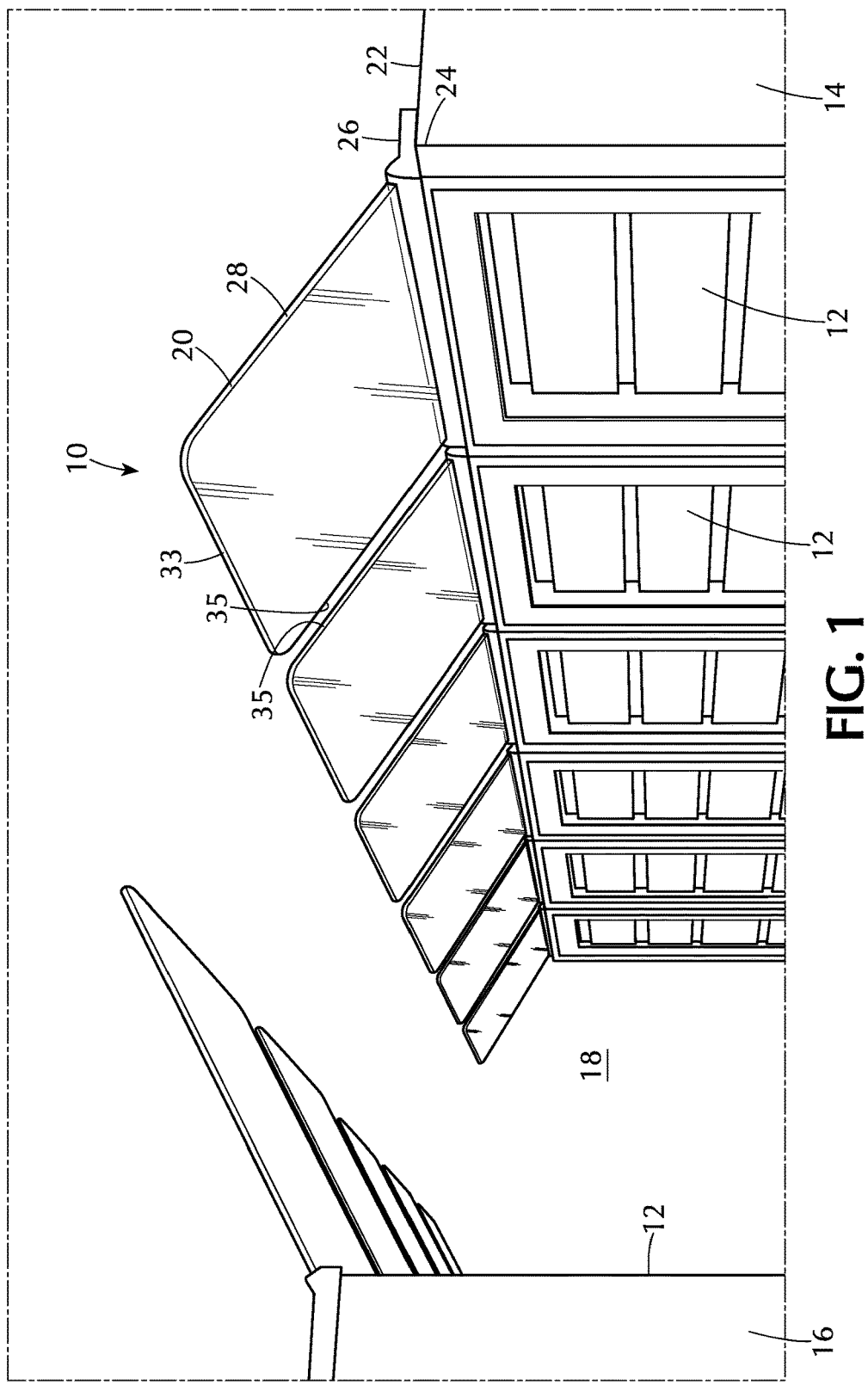
FIG. 1 is a perspective view of a first embodiment of an airflow baffle system constructed in accordance with the invention, shown in a data center environment.
Figure 2:
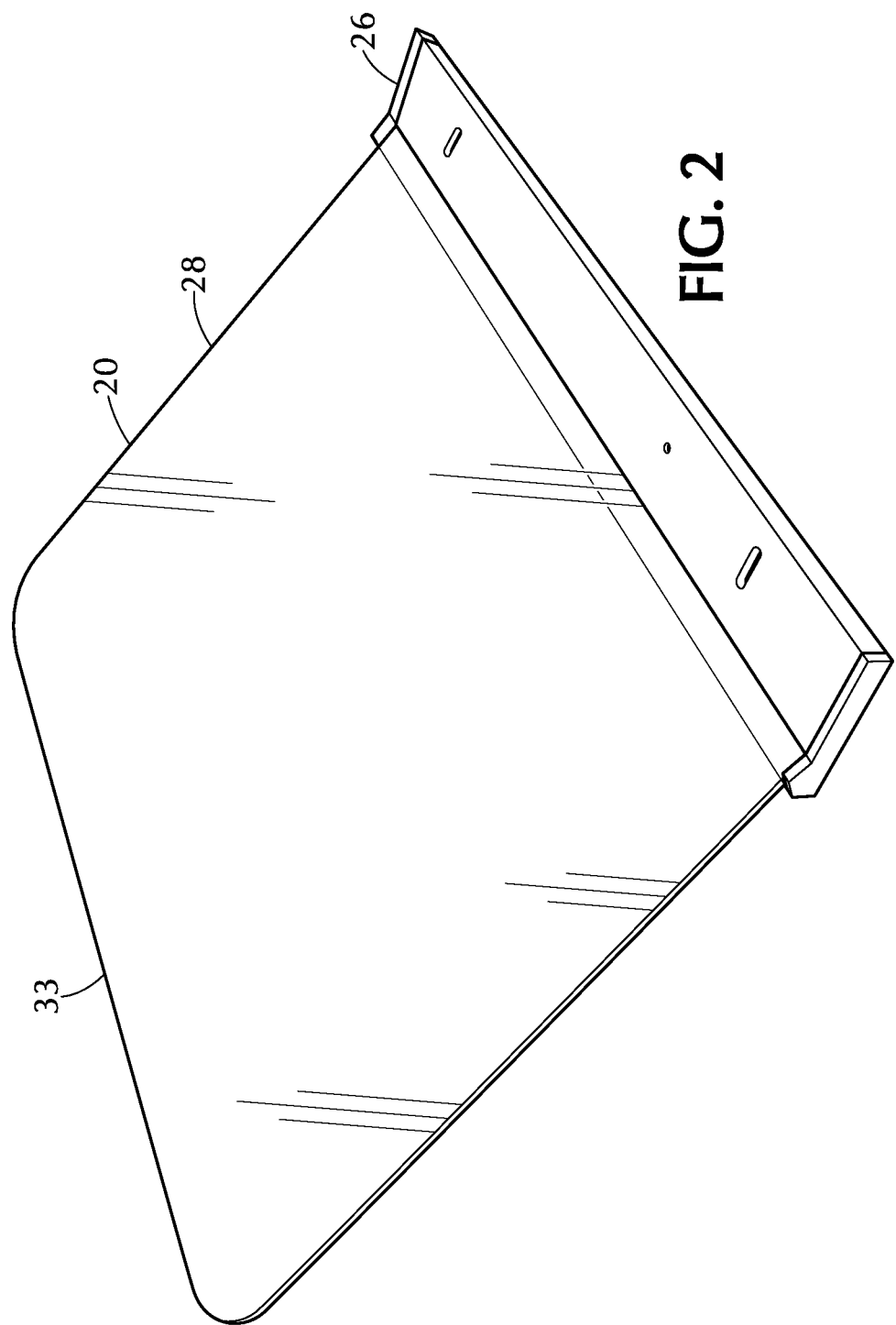
FIG. 2 is top perspective view of the airflow baffle of the system of FIG. 1.

Referring to FIG. 1, the airflow baffle system 10 is particularly suitable for airflow management in data centers and the like having a plurality of typically equal-height equipment cabinets 12 arranged side-by-side (typically abutting) in spaced-apart rows 14, 16 forming an aisle 18 between the rows. Such equipment cabinets typically house computer servers, networking equipment and other electronic equipment which require conditioned (cool) air to maintain proper operating temperatures. In the case of a "cold aisle," front faces of the cabinets face the aisle 18 and the conditioned air may be supplied to aisle through a raised-floor plenum or another suitable method. Typically, the conditioned air is drawn through the electronic equipment by internal fans of the equipment or by other means and the resulting heated air exits through a rear of the cabinet into a "hot aisle" and is returned to the source of the conditioned air.

Referring to FIGS. 1-4, in a first embodiment, the airflow baffle system 10 includes one or more airflow baffles 20 mountable to a top 22 of a cabinet 12. Each airflow baffle 20 has an elongated base 26 removably mountable to the cabinet 12 along or adjacent an aisle-facing edge 24 of the cabinet (e.g., typically a front edge for a "cold" aisle, or a back edge for "hot" aisle), and a rigid, preferably planar or curved airflow diverter panel 28 extending in a cantilevered manner upward from a base 26.

Figure 3:
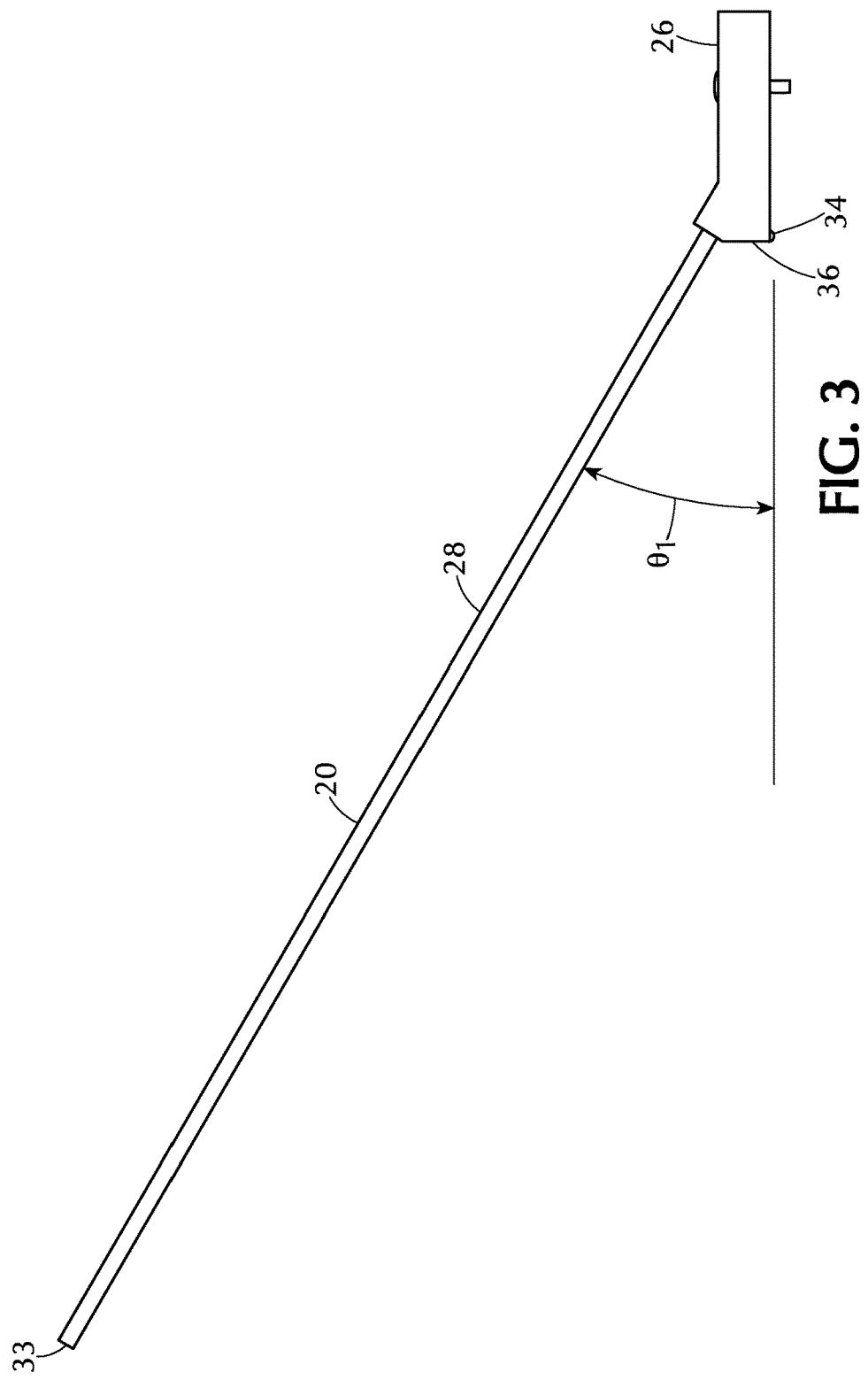
FIG. 3 is a side elevation view of the airflow baffle of the system of FIG. 1.
Figure 4:
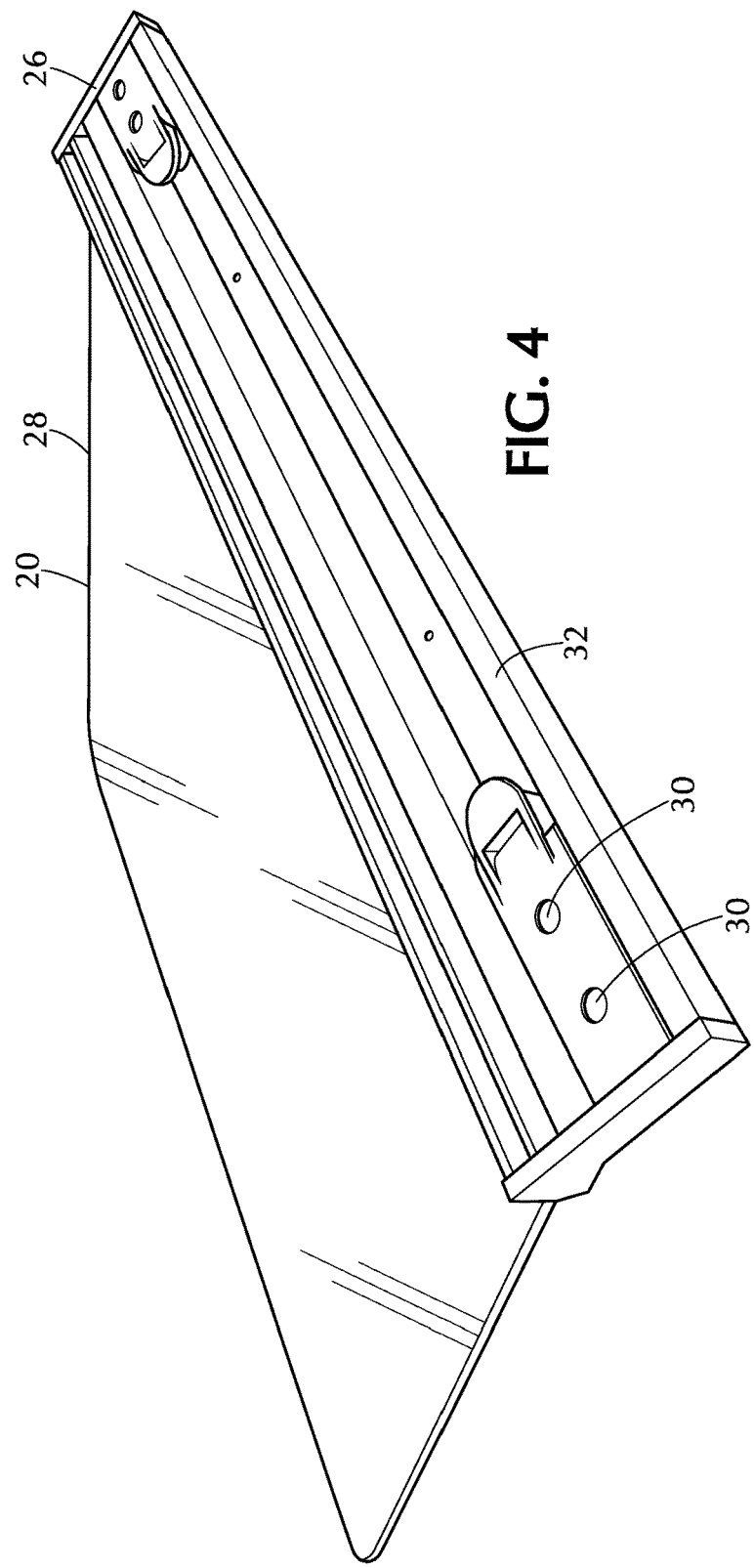
FIG. 4 is a bottom perspective view of the airflow baffle of the system of FIG. 1.
Figure 5:
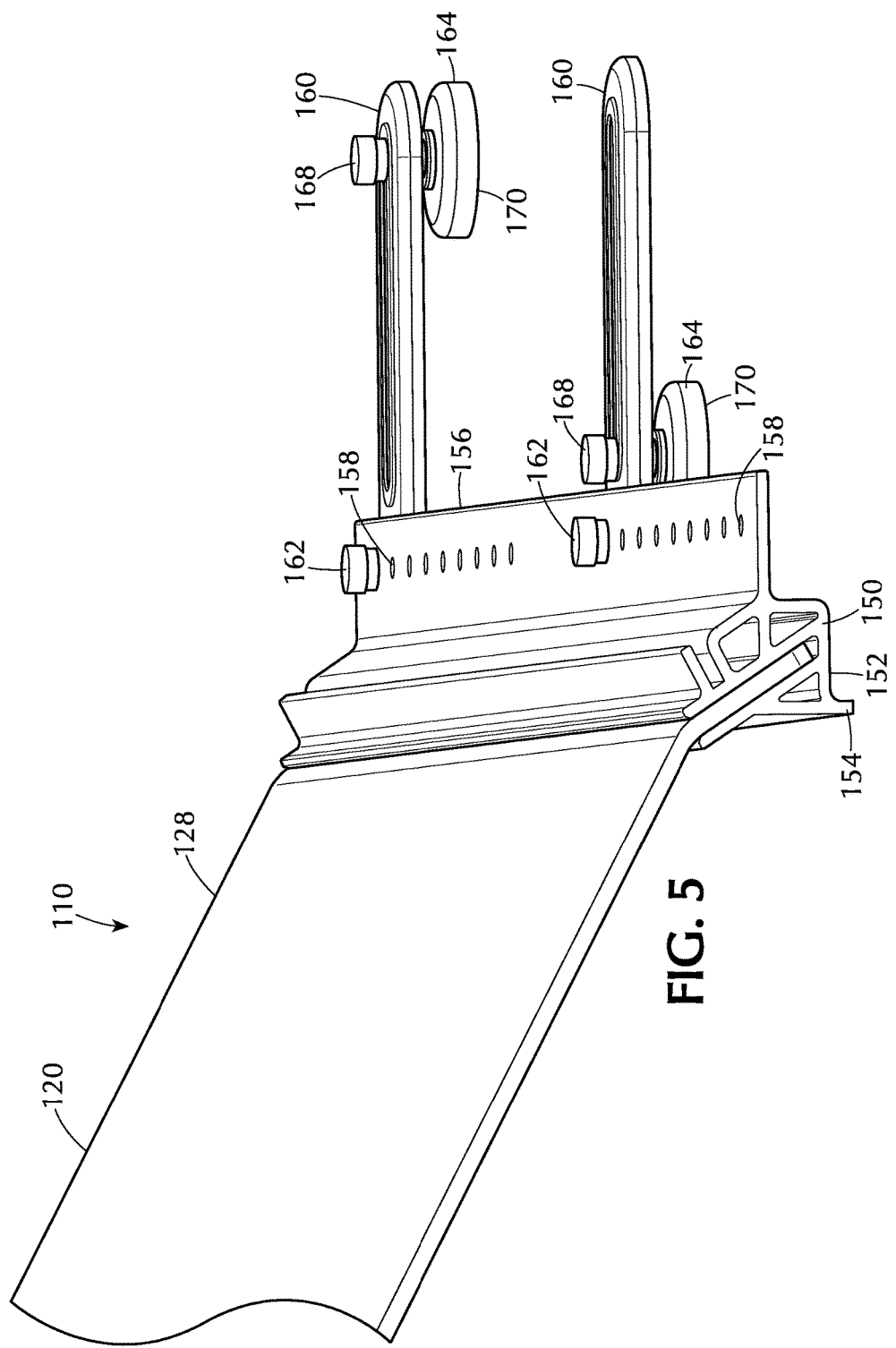
FIG. 5 is a perspective view of a second embodiment of the airflow baffle system.

The base 26 can include one or more magnets 30 on a bottom 32 of the base 26 to removably magnetically mount the airflow baffle 20 to a metallic portion of the top 22 of the cabinet 12 (FIG. 4). Additionally, the base 26 may include a downwardly depending lip 34 on a front edge 36 of the base 26 to engage the aisle-facing edge 24 of the cabinet 12 (FIG. 3).

Preferably, a width of the base 26, as measured along a longitudinal (long) axis of the base 26, is substantially equal to a width of the cabinet 12, as measured in a horizontal direction parallel to the aisle-facing edge 24 of the cabinet 12. For example, the base 26 can have a width of about 23.75 or 23.875 inches for a 24 inch-wide cabinet, about 29.75 or 29.875 inches for 30 inch-wide cabinet, and about 31.25 or 31.375 inches for 31.5 inch-wide cabinet. Preferably, a width of the airflow diverter baffle 28 is substantially equal to the width of the base 26. However, the width of the panel 28 can be greater or lesser, for example the width of the panel 28 can be substantially equal to a 600 mm, 750 mm and 800 mm cabinet width, or another width. Alternatively, the width of the base 26 and airflow diverter panel 28 can be substantially equal to a whole number of cabinets (e.g., 1, 2 or 3 cabinets, etc.).

The airflow diverter panel 28 can have a length (as measured from the base 26 to a free end 33 of the panel 28) of about 18 inches. The panel 28 can be fixed relative to the base 26 such that when the baffle 20 is mounted to a cabinet 12 the panel 28 is aligned at a fixed angle ($\theta_1$) relative to the cabinet 12 (e.g., 30 degrees from a horizontal plane), and such that the panel 28 extends into the aisle 18 about 15 inches (as measured horizontally). Alternately, each panel 28 can be aligned horizontally, vertically or at another angle.

Preferably, the airflow diverter panel 28 may be constructed of transparent material, such as clear or tinted polycarbonate for maximum light transmissibility. However, other transparent, translucent or opaque materials are also suitable for the panel. The panel 28 preferably complies with or surpasses NFPA standards for fire protection of Information Technology Equipment and/or is UL94V0 rated.

An airflow baffle 20 can be mounted on each of a plurality of adjacent cabinets 12 in the rows 12, 14, on one or both sides of the aisle 18, to form a substantially continuous air barrier along a full length of one or both rows of cabinets 12, 14 (FIG. 1). Each airflow diverter panel 28 can be aligned at an angle ($\theta_1$) relative to a horizontal plane such that the panels 28 projects upwardly from the top 22 of the cabinet 12 and toward a center of the aisle 18. Preferably, the airflow diverter panels 28 of each airflow baffle 20 in a row 12, 14 are aligned at the same or substantially the same angle such that they form a substantially continuous air barrier.

When the cabinets 12 in a row 14, 16 are all the same height and the airflow diverter panels 28 are aligned at the same angle, the side edges 32 of the panels are closely aligned in parallel (for example about 0.25-0.50 inches apart). To enhance the effectiveness of the air barrier formed by the airflow baffles 20, one or both airflow diverter panels 28 of adjacent baffles can include a gasket (or other flexible or rigid insert) mounted to the side edges 35 of adjacent panels 28, to seal the gap therebetween.

When mounted on a cabinet 12, the airflow diverter panel 28 of the airflow baffle 20 inhibits hot- and cold-air mixing. Particularly, when the airflow diverter panel 28 extends at an upwardly inclined angle into a cold aisle 18, it increases the pressure in the aisle thereby inducing the flow of conditioned air into the electronic equipment. When the airflow diverter panel 28 extends vertically on either side of a hot aisle, it directs heated air above the cabinets thereby inhibiting mixing of hot and cold air.

Typically, adjacent cabinets 12 in a row 14, 16 abut each other. However, a gap may exist between cabinets in a row, for example where the presence of a support column requires a gap between successive cabinets. To provide for when there exists a gap between cabinets, an airflow diverter gap panel, for example substantially of the size and shape of the airflow diverter panel 28, may be removably affixed between the airflow diverter panels 28 of adjacent air diverter baffles 20 connected to the spaced-apart cabinets. The airflow diverter gap panel can be connected to the adjacent airflow diverter panels 28 by the aforementioned gaskets or another suitable support mechanism. As can be appreciated, such a gap panel could also be employed on a continuous row of racks (having no gaps between cabinets), for example by attaching airflow baffles 20 to every other cabinet in a row and interconnecting the baffles 20 with gap panels to effectively create a continuous air barrier along the length of the row of cabinets.

Depending on the needs of the application, the airflow baffles 20 can be installed in an angular position (e.g., overhanging a cold aisle), or may instead be installed in a vertical position to better protect against hot and cold air mixing. Airflow baffles 20 can be mounted on both the front and/or back top edges of the cabinets, such as placing the airflow baffles 20 in an angular position on the aisle-facing (front) edge of the cabinet adjacent a cold aisle and in a vertical on the aisle-facing (back) edge of the same cabinet adjacent the hot aisle.

The airflow baffles are modular and can be positioned across the top of each cabinet on both sides of the aisle, or can be used individually to spot reduce high temperature locations. Airflow baffles can improve airflow efficiency and/or reduce server inlet temperatures in both raised floor or slab environments, and other environments.

When airflow baffles 20 are positioned angularly, for example to address the cold airflow exiting tiles in a cold aisle in a raised floor environment, the airflow baffles 20 create an interruption to the vertical airflow and pressurize the cold aisle, allowing the servers or other equipment housed in the cabinets to better utilize the cold air before the air escapes to the ceiling, which can reduce or eliminate the inflow of non-conditioned air from the room. Angular airflow baffles 20 also isolate the return of the hot air from the cold aisle. When the airflow baffles 20 are positioned in a vertical position atop the front edge of the rack adjacent the cold aisle, their aim is to perform more as a heat shield and isolate the hot exhaust server air from returning to the cold inlet side of the servers. When airflow baffles 20 are positioned vertically to address the hot airflow exiting the hot aisle, the baffles 20 create a heat shield barrier, interrupting the flow of hot air attempting to return the cold aisle and also help create a chimney effect to focus the hot air towards the ceiling.

Referring to FIGS. 5-9, in a second embodiment, the airflow baffle system 110 includes an airflow baffle 120 having an elongated base 126 and an airflow diverter panel 128 extending in a cantilevered manner upward from a base 126. The airflow baffle 120 of the second embodiment (and all other embodiments) has a similar construction, and is suitable for the same purposes and environments, in the same arrangements, as the airflow baffle 20 discussed herein with respect to the first embodiment.

The base 126 and airflow diverter panel 128 of the airflow baffle 120 (and all other embodiments) can have the same general dimensions as the airflow baffle 20 of the first embodiment, including width and length dimensions.

A plurality of airflow baffles 120 may be mounted on each of a plurality of adjacent cabinets in a rows cabinets on one or both sides of an aisle, to form a substantially continuous air barrier along a full length of one or both rows of cabinets and each airflow diverter panel 128 can be aligned at an angle relative to a horizontal plane such that the panels 128 projects upwardly from a top of the cabinets and toward a center of the aisle. Alternately, each panel 128 can be aligned horizontally, vertically or at another angle. Preferably, the airflow diverter panels 128 of each airflow baffle 120 on a row of cabinets are aligned at the same or substantially the same angle such that they form a substantially continuous air barrier.

The base 126 can be an integral rigid metal extrusion or can comprise separate components connected together. The base 126 can have a contact portion 154 along a width thereof for supporting the airflow baffle 120 on a top of an equipment cabinet, adjacent an aisle-facing edge thereof. Preferably the contact portion 154 is in the form of a downwardly-extending, vertically-aligned flange having a bottom (free) edge providing a narrow, elongated support fulcrum along the width (or substantially the entire width) of the base 126.

An intermediate portion 150 of the base 126 extends horizontally rearwardly from a top of the contact portion 154. Preferably the intermediate portion 150 is at a position higher than the bottom edge of the contact portion 154.

The base 126 can have a mounting flange 156 extending horizontally rearwardly along the width of the base 126, opposite the airflow diverter panel 128 with respect to the contact portion 150. Preferably, the mounting flange 156 is at a position higher than the contact portion 154 and the intermediate portion 150. The mounting flange 156 can have a plurality of mounting holes 158 disposed thereon, along a width of the base 126.

A plurality of (preferably two) elongated mounting arms 160 are attached to the mounting flange 156 and can extend outwardly from the mounting flange 156 in a direction opposite (away from) the airflow diverter panel 128 with respect to the contact portion 150. Each mounting arm 160 is preferably at least about 5 inches long. Each mounting arm 160 can be connected to the mounting flange 156 by a removable, adjustable fastener 162 (such as a thumb screw or the like or another suitable adjustable fastener) directed through a mounting hole 158 in the mounting flange 156 and into a corresponding mounting hole in an end of the mounting arm 160. A position of the mounting arm 160 can be adjusted along the mounting flange 156 by removing the adjustable fastener 162 to disconnect the mounting arm 158 from the mounting flange 156, moving the mounting arm 158 to a different mounting hole 158, and reconnecting the mounting arm 158 to the mounting flange 156 with the adjustable fastener 162. The mounting arms 160 can extend horizontally perpendicularly outwardly from the mounting flange 156 or can pivot underneath the mounting flange, or can be in any angular position. The mounting arm 158 is selectively pivotal in a horizontal plane relative to the base 126 (e.g., 180 degrees) and is fixable in a plurality of angular orientations in the horizontal plane (preferably infinitely adjustable) by operation of the adjustable fastener 162. Alternatively or additionally, the mounting flange 156 can include a slot (not shown) to allow adjustment of a position of the mounting arm 158.

A magnet 164 is attached to each mounting arm 160 for removably, magnetically connecting the airflow baffle 120 to a cabinet or other metallic structure. Preferably, each mounting arm 160 includes a slot 166 along a length of the mounting arm 160 and the associated magnet 164 is connected to the mounting arm 160 by an adjustable fastener 168 (such as a thumb screw or the like, or a similar adjustable fastener) directed through the slot 166 from a top of the mounting arm 160 into the magnet 164, such that a position of the magnet 164 along the mounting arm 160 can be selectively adjusted and fixed by operating the adjustable fastener 168. Alternatively or additionally, the mounting arm 160 can include a plurality of mounting holes (not shown) to allow adjustment of a position of the magnet 164.

Figure 6:
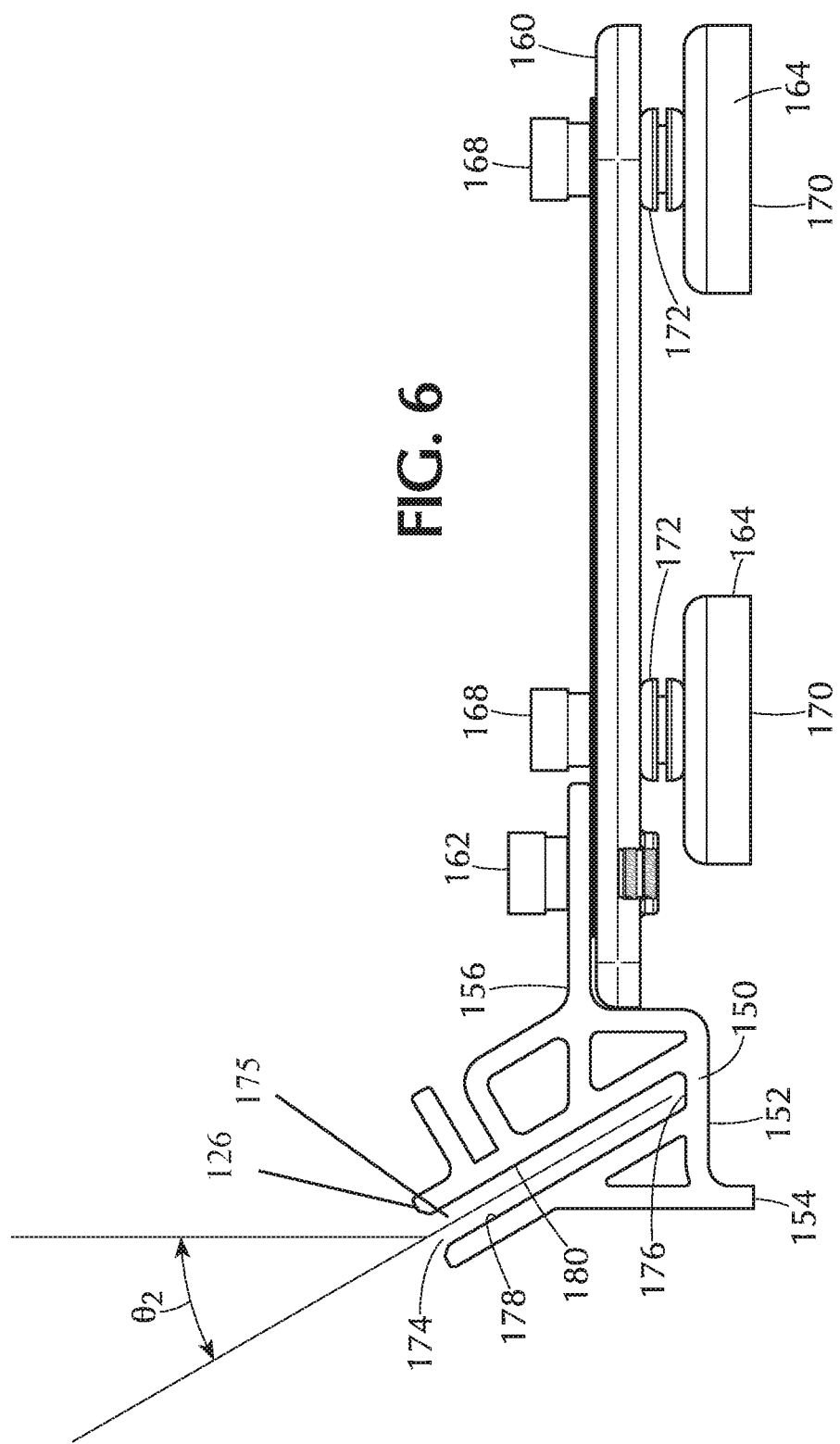
FIG. 6 is a side elevation view of a base of the airflow baffle system of FIG. 5.
Figure 7:
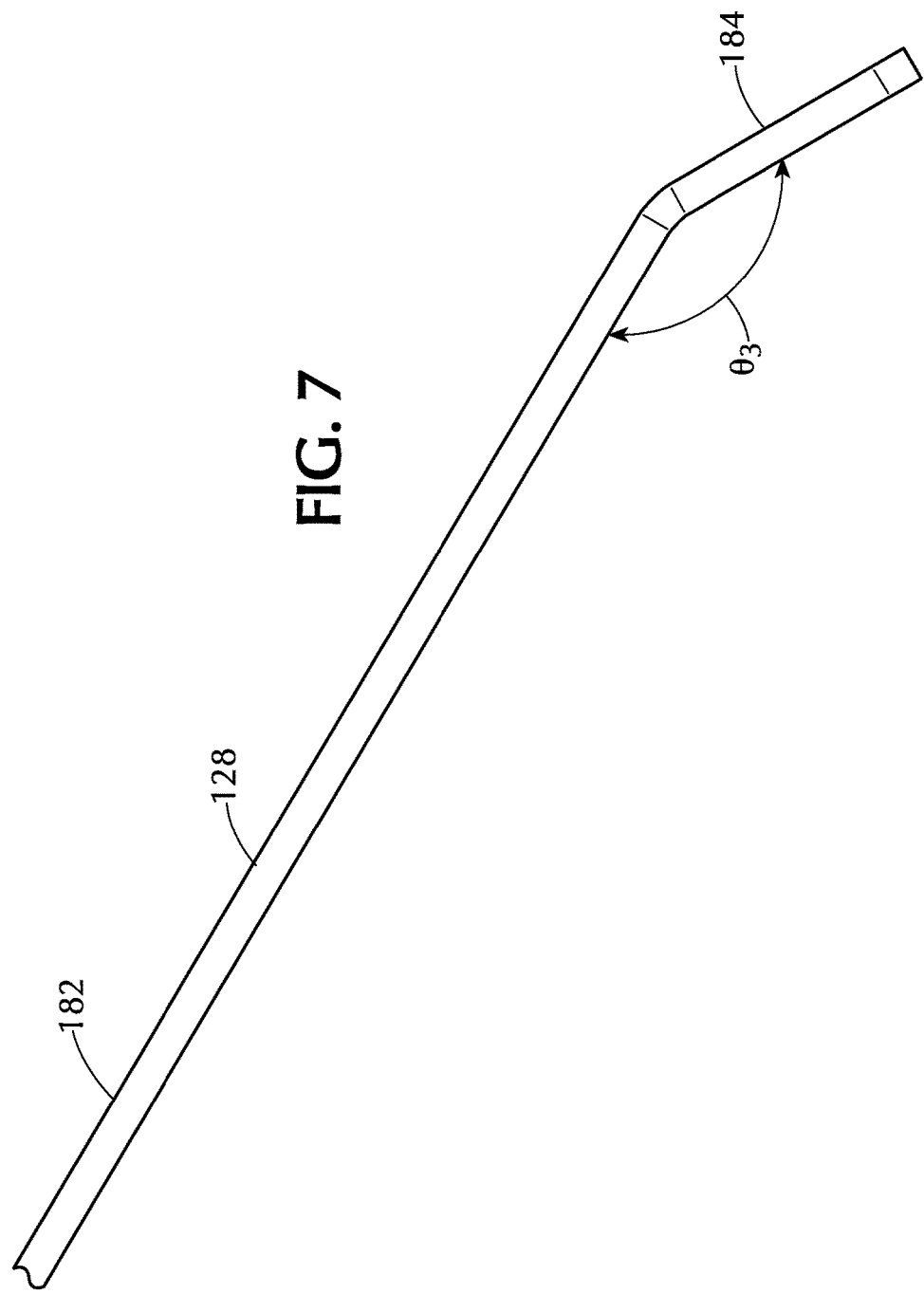
FIG. 7 is a side elevation view of an airflow diverter panel of the airflow baffle system of FIG. 5.

The magnet 164 can be substantially disc-shaped with a planar bottom surface 170. The bottom surface 170 of the magnet 164 can be at the same height as the bottom edge of the contact portion 154 of the base 126 and, in a rest position, the bottom 170 can be on, and substantially parallel to, a plane touching the bottom edge of the contact portion 154. Preferably, a connection between the magnet 164 and the mounting arm 160 allows the magnet 164 to pivot about a plurality of (or all) horizontal axes such that the orientation of the magnet 164, including the bottom surface 170 thereof can adjust to conform to various target mounting surfaces (e.g., the top of a cabinet) to maximize magnetic adhesions to the surface. As an example, an annular elastomeric grommet 172 can be disposed between the magnet 164 and the mounting arm 160 with the adjustable fastener 166 directed through a center opening of the grommet 172 into the magnet 164 (FIG. 6). Upon tightening of the adjustable fastener 166 to fix the position of the magnet 164 along the mounting arm 160, the grommet 172 will compress. However, the elastomeric characteristic of the grommet 172 will allow the magnet 164 to pivot relative to the mounting arm 10, to adjust to the target mounting surface.

The magnets 164 connected to the elongated mounting arms 160 extending from the mounting flange 156 are spaced from the contact portion 154 of the base 126 and provide a countervailing force (moment), opposite a fulcrum created by the contact portion 154, to balance a weight of the airflow diverter panel 128, which in certain configurations may be extended in a cantilevered fashion into the aisle.

The base 126 has an upwardly-open channel 174 along a width of the base 126 (i.e., parallel to a longitudinal axis of the base 126) for supporting the airflow diverter panel 128. The channel 174 can have a pair of opposed, parallel side walls 178, 180 and a bottom 176 to support the airflow diverter panel 128. The channel 174 is preferably disposed above the intermediate portion 150 of the base 126 which forms the bottom 176 of the channel 174. The channel 174 is sized and shaped to closely, removably receive the airflow diverter panel 128. The channel 174 preferably has an opening 175 with a dimension (as measured between the opposed walls 178, 180) substantially equal to or slightly greater than a thickness of the airflow diverter panel 128. For example, the airflow diverter panel 128 can have a thickness of about 0.175 inches and the channel 150 can have an opening 175 of about 0.200 inches.

The channel 174 is preferably aligned at a forwardly-tilted angle (e.g., about 60 degrees) relative to the horizontal (e.g., relative to the contact portion 150 of the base 126 when mounted), and at an angle ($\theta_2$) of about 30 degrees relative to vertical, as for example measured from a plane intermediate and parallel to the opposed side walls 178, 180.

The airflow diverter panel 128 can have an upper portion 182 forming a majority of the height and surface area of the panel 128, and a lower portion 184 having a minority of the height (e.g., about 1-2 inches). The lower portion 184 is preferably aligned at an internal angle ($\theta_3$) relative to the upper portion 182 greater than 90 degrees (e.g., about 150 degrees).

The channel 174 of the base 126 is sized and shaped to removably receive and support the airflow diverter panel 128 by the lower portion 184. One or more mounting screws 186 (or other suitable removable or other fasteners) can be directed into the channel 174 into contact with the lower portion 184 to secure the panel 128.

Figure 8:
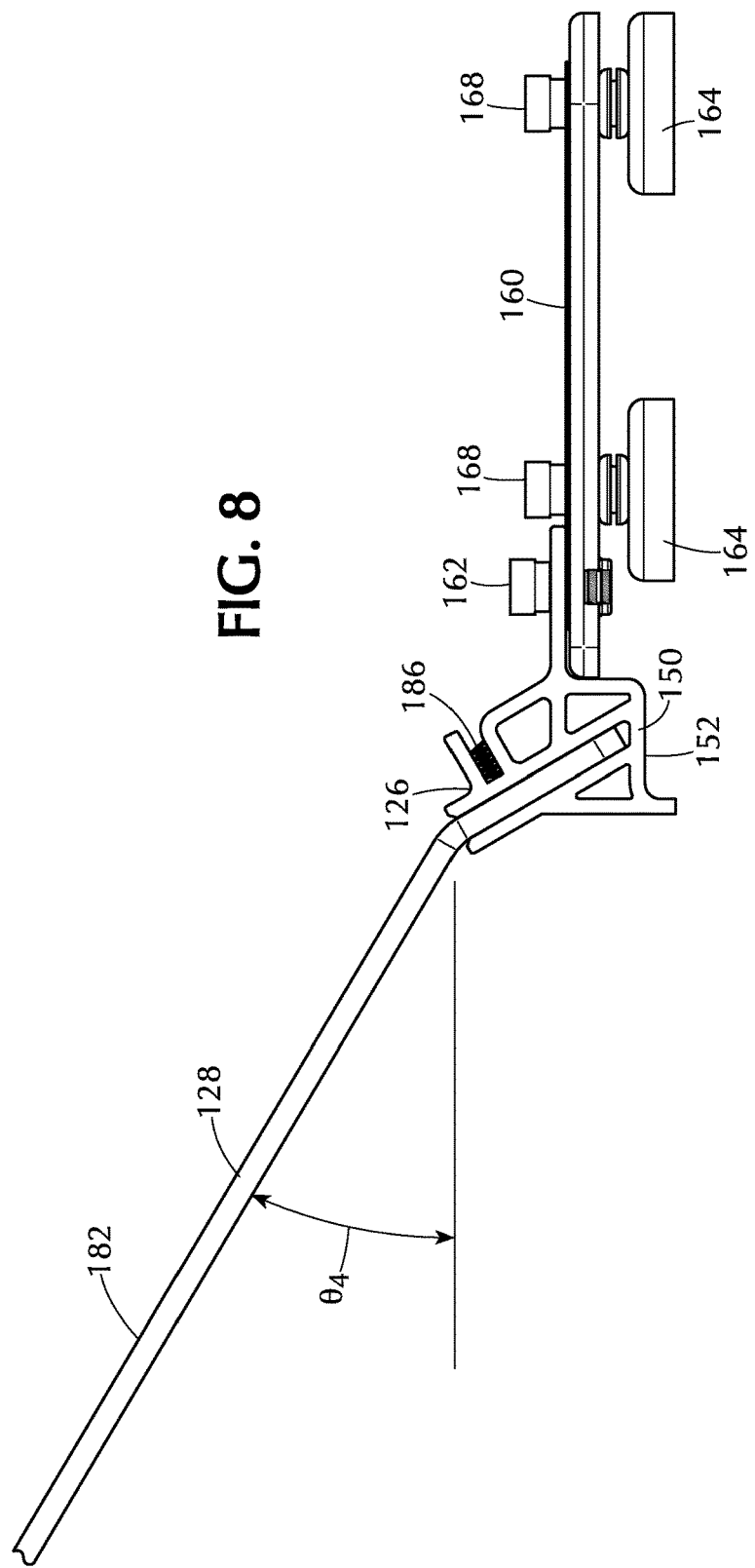
FIG. 8 is a side elevation view of the airflow baffle system of FIG. 5, showing the airflow diverter panel in an inclined orientation.
Figure 9:
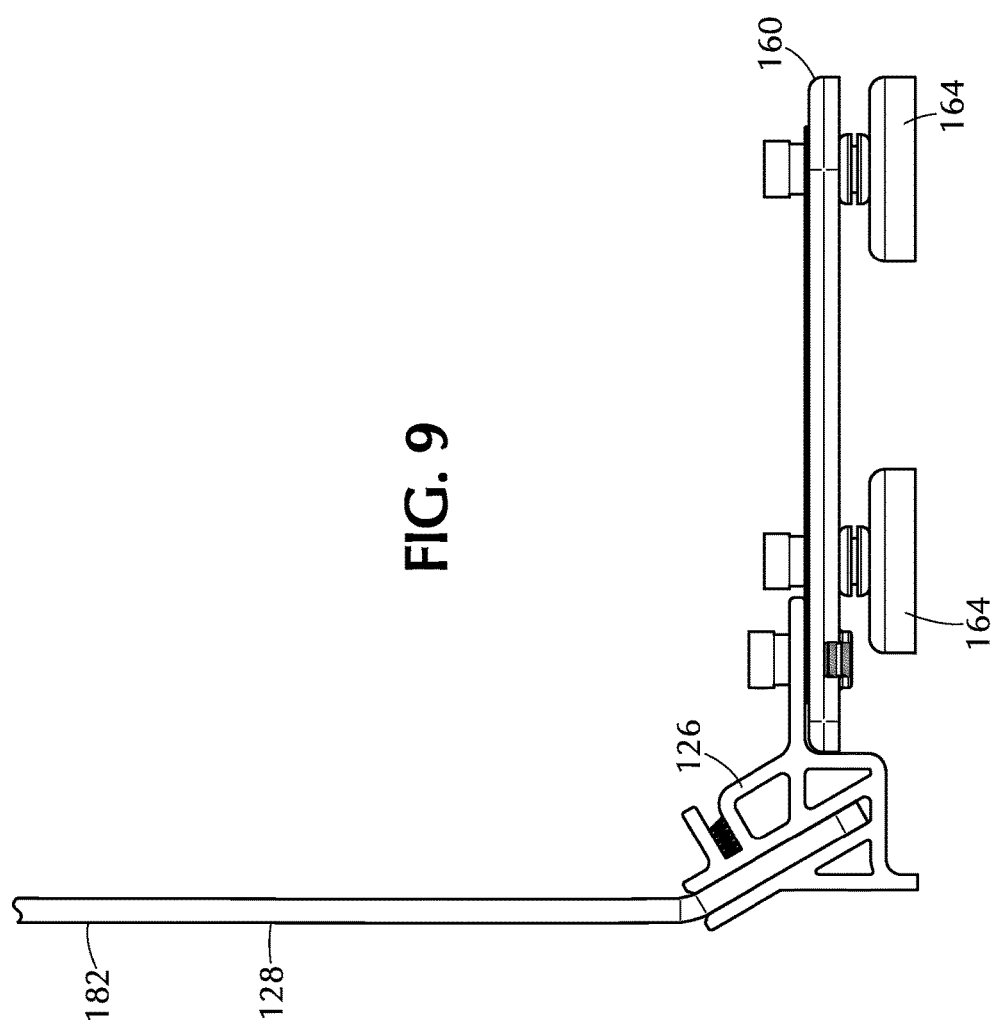
FIG. 9 is a side elevation view of the airflow baffle system of FIG. 5, showing the airflow diverter panel in a vertical orientation.
Figure 10:
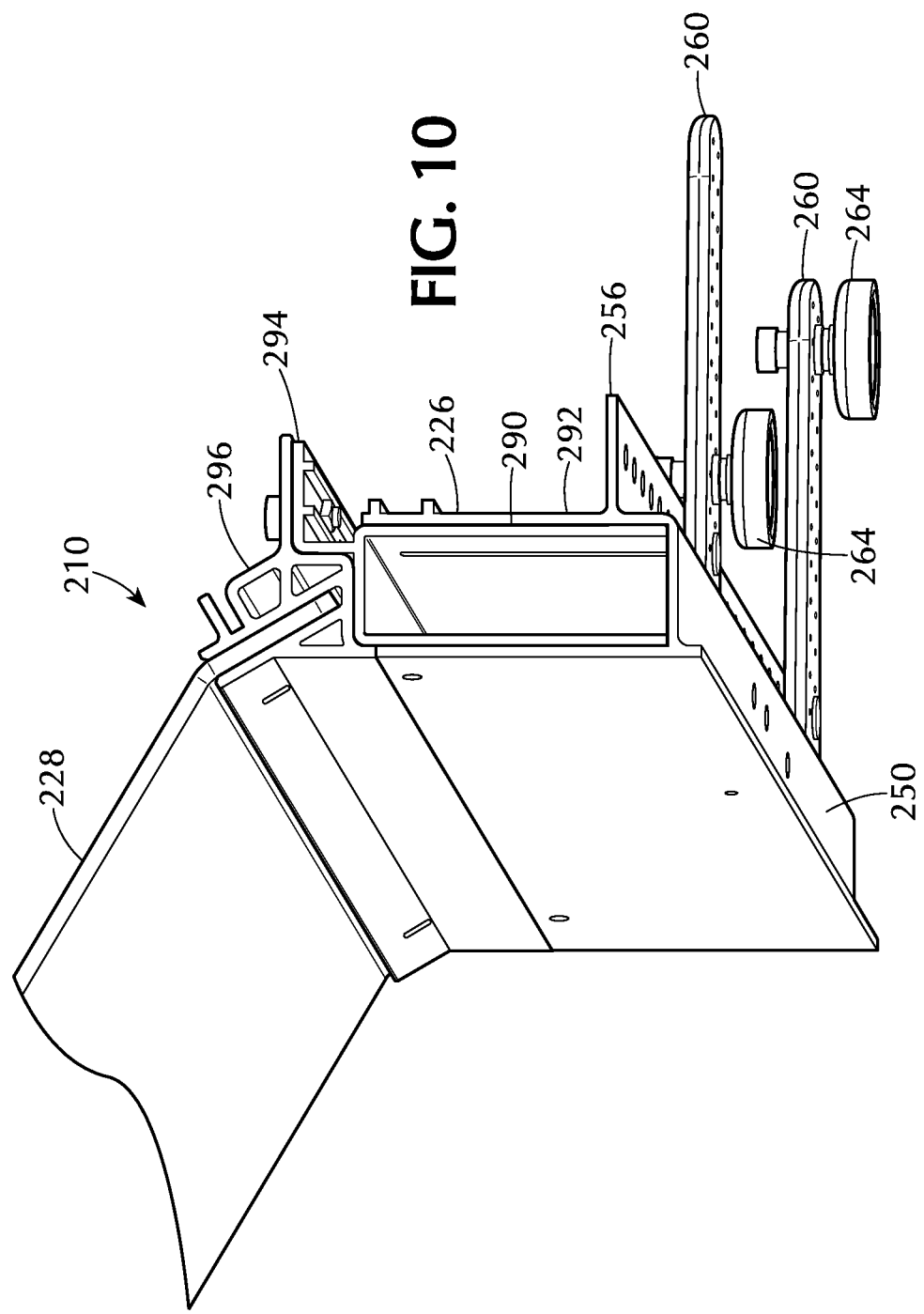
FIG. 10 is a perspective view of the airflow baffle system of FIG. 5, showing a riser in a low position.
Figure 11:
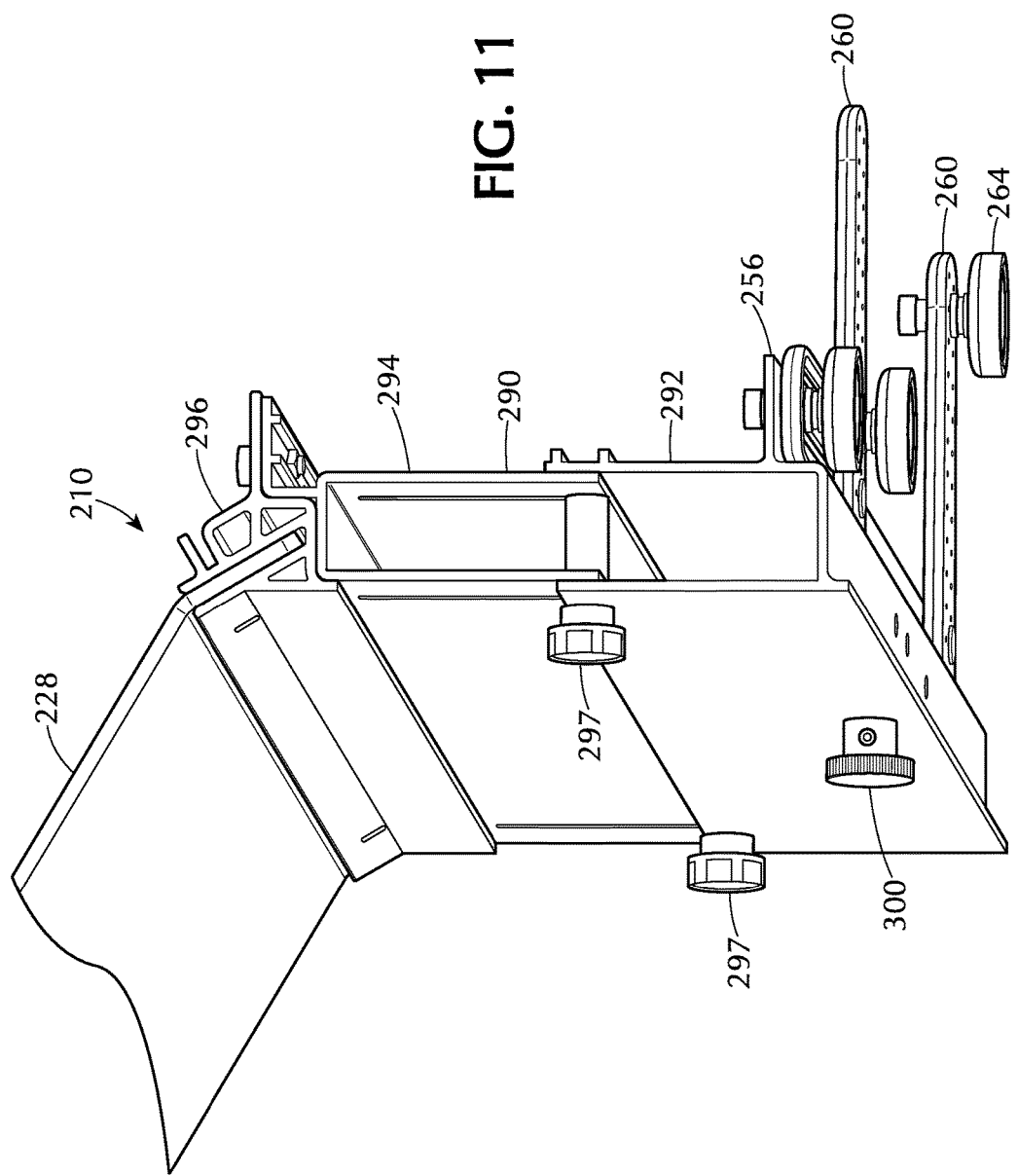
FIG. 11 is a perspective view of the airflow baffle system of FIG. 10, showing the riser in a high position.
Figure 12:
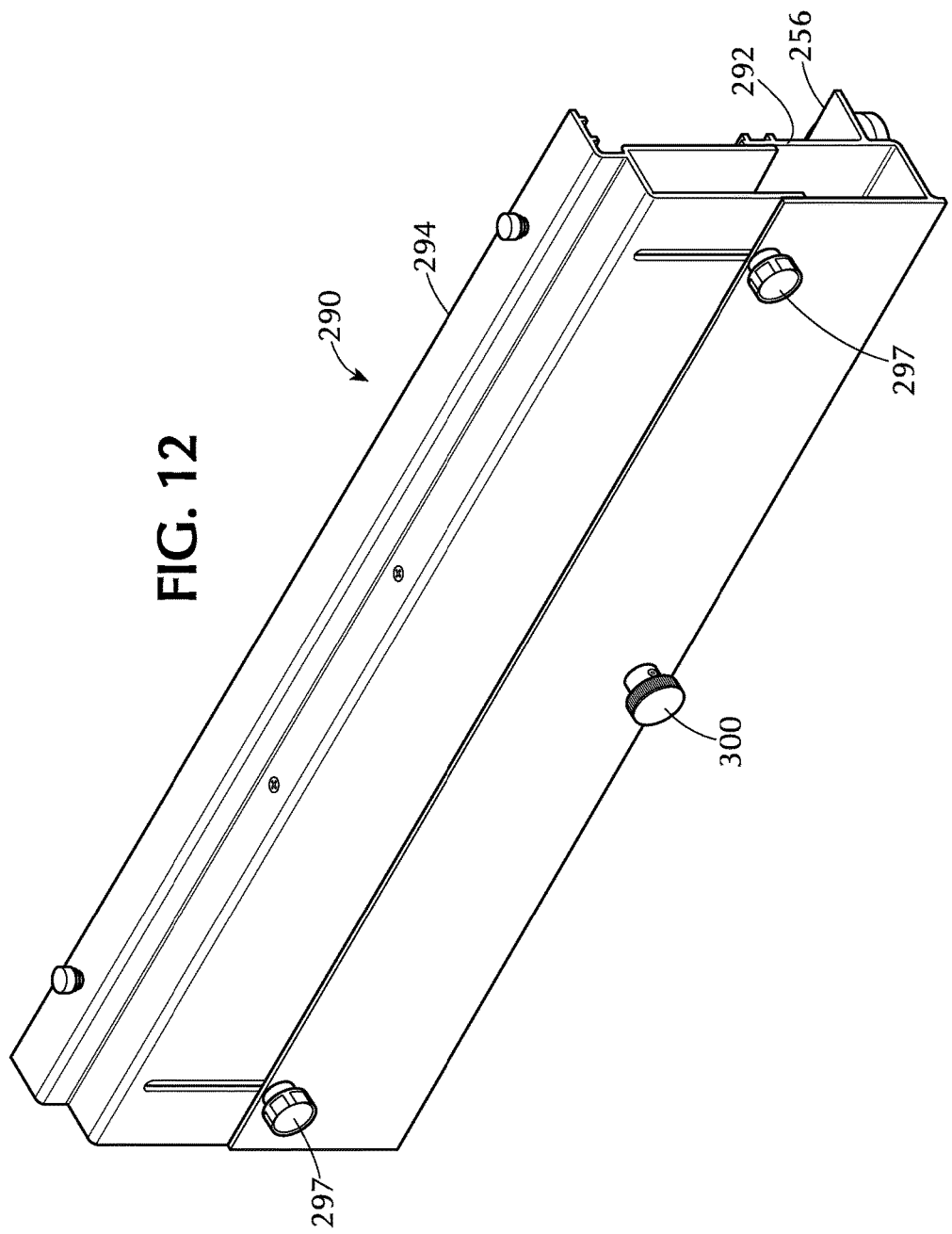
FIG. 12 is a perspective view of the riser of the airflow baffle system of FIG. 10.
Figure 13:
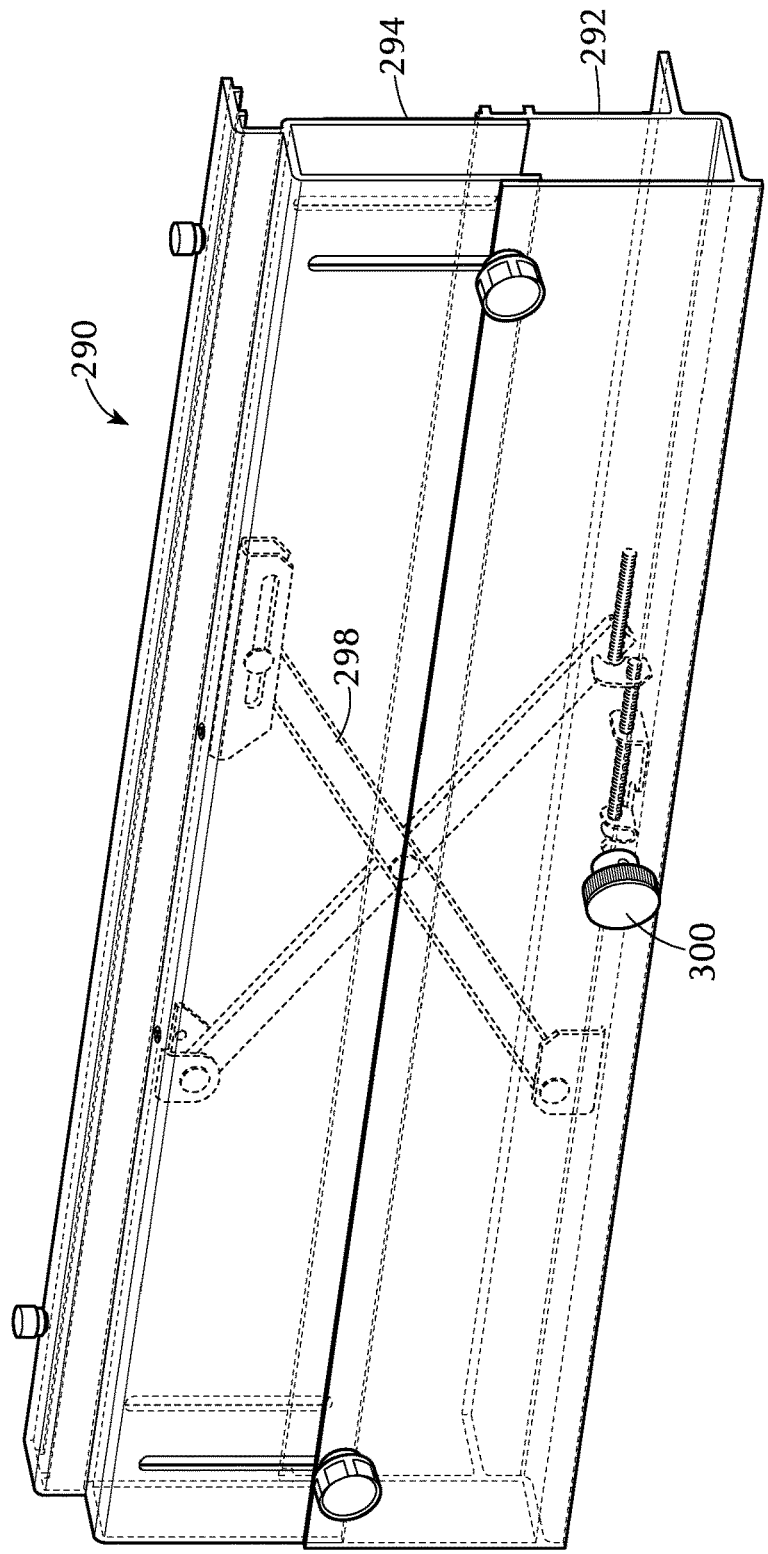
FIG. 13 is a perspective view of the riser of the airflow baffle system of FIG. 10, showing mechanisms for adjusting and fixing a height of the riser.

Preferably, the airflow diverter panel 128 can be mounted in the channel 174 in at least two positions, including a first position with the interior angle ($\theta_3$) directed downwardly, wherein the upper portion 182 of the airflow diverter panel 128 extends forwardly and is aligned at an angle relative to horizontal, for example at an angle ($\theta_4$) of about 30 degrees relative to horizontal (FIG. 8). Alternatively, the airflow diverter panel 128 can be mounted in a second (reversed) position, with the interior angle directed upwardly, wherein the upper portion 182 is aligned vertically (FIG. 9). Other relative angles of the channel 174 and lower portion 184 of the airflow diverter panel 128 are contemplated. However, preferably the relative angles of the channel 174 and the lower portion 184 of the panel 128 are complementary such that in one position of the panel 128, the upper portion 182 is aligned at an angle relative to horizontal and vertical (i.e., an angle less than 90 degrees relative to horizontal) and in a second (reversed) position, the upper portion 182 of the panel 128 is aligned vertically. A sum of the internal angle $\theta_3$ of the airflow diverter panel 120 (e.g., about 150 degrees) and the angle $\theta_2$ of the channel 174 formed with a vertical direction (e.g., about 30 degrees) is preferably substantially or about 180 degrees. Alternatively, the relative angles of the channel 174 and lower portion 184 of the panel 128 are such that in the first and second (reversed) position, the upper portion 182 of the panel 128 is aligned at two different angles relative to horizontal, each less than 90 degrees.

Referring to FIGS. 10-14, in a third embodiment the airflow baffle system 210 the base 226 can include a riser 290 to adjust the airflow diverter panel 228 to a height common to other baffles in the row, for when equipment cabinets in a row are of uneven height, or other uses. The riser 290 can include a lower portion 292 operable to connect to a top of an equipment cabinet and can include an upper portion 294 which is selectively movable and fixable in a vertical direction relative to the lower portion 292 to adjust a height of the airflow diverter panel 228 with respect to a top of the equipment cabinet. The upper portion 294 of the riser 290 can be slidingly received within the lower portion 292 to adjust a height of the airflow diverter baffle 228.

The base 226 can include a fixed-height portion 296 corresponding the aforementioned bases 26, 126 of the first and second embodiments which is unitary with or separable from the riser 290 and which supports the airflow diverter panel 228. The upper portion 294 of the riser 290 can be shaped complementary to and adapted to connect to and support the fixed-height portion 296 of the base.

The lower portion 292 of the riser 290 preferably has dimensions and mounting structure similar to the base of the aforementioned embodiments including a contact portion 250, rearwardly-extending mounting flange 256, mounting arms 260 and magnets 264.

Adjustable fasteners 297 such as thumb screws or other suitable fasteners can be disposed on a front of the riser 290 adjacent lateral ends of the raiser 290 to selectively adjust and fix a vertical height of the upper portion 294 (and the airflow diverter baffle 228) relative to the lower portion 292. The riser 290 can include a scissor mechanism 298 or other suitable mechanism to adjust the height of the riser 290. The scissor mechanism 298 can be operable by a knob 300 accessible from the front of the riser 290, to provide for a controlled, single point of adjustment of the height of the riser 290.

As an alternative to the riser, or in addition thereto, where adjacent cabinets have different heights, optional vertical baffles can be mounted vertically between adjacent panels to provide a seal between panels. Such vertical baffles can be substantially rhomboid.

In a further embodiment, the airflow diverter panel may also be adjustable and pivot relative to the base such that the angle of the panel relative to the cabinet can be adjusted through 90 degrees or 270 degrees, or more. For example, the airflow diverter panel can rotate relative to the base from a vertically downwardly-pointing orientation, flat against the front of the cabinet (or servers), to a horizontal orientation, flat against the top of the cabinet. A push button on the base and accessible from the front of the cabinet (or another suitable mechanism) can be provided to allow adjustment of the position of the airflow diverter panel. Alternatively, the airflow baffle can include a remote control system for adjusting the angle of the panel.

The airflow diverter panel can include means to cause the panel to be removed as an obstruction to a fire suppression agent (for example water based, dry agent or another agent) in the case of an actuation of a fire suppression system. For example, the airflow diverter baffle may include a heat sensitive spring, fusible link, electronic actuation, or another means to, for example rotate the panel to a position that does not create an obstruction to the fire suppression agent deployment, shrink the panel and/or cause the panel fall off of the base (for example by a tether), or may include another means to remove the obstruction to the fire suppression agent dispersion.

It should be understood that the specific form of the invention herein illustrated and described is intended to be representative only, as certain changes may be made therein without departing from the clear teachings of the disclosure. Accordingly, reference should be made to the following appended claims in determining the full scope of the invention.

What is claimed is:

1. A cabinet-top airflow baffle system for a data center, suitable to manage airflow within an aisle formed by adjacent rows of closely-spaced equipment cabinets, the airflow baffle system comprising:
    an airflow baffle having a base and an airflow diverter panel;
    the base being operable to removably mount to a top of an equipment cabinet and having a contact portion operable to contact the top of the equipment cabinet adjacent an aisle-facing edge of the equipment cabinet;
    the airflow diverter panel being supported by and extending upwardly from the base;
    a mounting arm connected to the base;
    a magnet connected to and depending downwardly from the mounting arm, the magnet being operable to magnetically connect to the top of the equipment cabinet spaced from of the contact portion of the base;
    the airflow diverter panel having an upper portion operable to influence airflow and having a lower portion operable to mount the airflow diverter panel to the base;
    the airflow diverter panel being removably mountable on the base in at least first and second positions;
    in the first position of the airflow diverter panel, the upper portion being in a first angular orientation relative to a horizontal plane;
    in the second position of the airflow diverter panel, the upper portion being in a second angular orientation relative to the horizontal plane which is more vertical than the first angular orientation;
    the base having at least one upwardly-open channel sized and shaped to receive and support the lower portion of the airflow diverter panel;
    the channel extending along a width of the base and having a pair of opposed, parallel side walls extending parallel to the width of the base forming an opening operable to receive the airflow diverter panel from above and the airflow diverter panel being removable from the channel, the channel having a bottom operable to support the airflow diverter panel from below, and the opening of the channel having a size, as measured between the opposed walls, adapted to receive the lower portion of the airflow diverter panel between the opposed walls; and
    the channel being adapted to support the airflow diverter panel by the lower portion of the airflow diverter panel such that the airflow diverter panel is supported by the base in a cantilevered manner.

2. An airflow baffle system, as in claim 1, wherein:
the mounting arm is connectable to the base in a plurality of positions along a width of the base, whereby the mounting arm can be located in a plurality of positions along a width of the equipment cabinet.

3. An airflow baffle system, as in claim 2, wherein:
the base has a plurality of mounting holes along the width of the base and the mounting arm is connectable to the base in any of the mounting holes.

4. An airflow baffle system as in claim 1, wherein:
the mounting arm is connected to the base by an adjustable fastener, and by operation of the adjustable fastener the mounting arm is selectively pivotal in a horizontal plane relative to the base and fixable in a plurality of angular orientations in the horizontal plane.

5. An airflow baffle system as in claim 1, wherein:
the magnet is connected to the mounting arm by a flexible connection permitting the magnet to pivot about horizontal axes relative to the mounting arm.

6. An airflow baffle system as in claim 5, wherein:
a resiliently compressible grommet is disposed between the magnet and the mounting arm; and
the grommet is operable to permit the magnet to pivot about any horizontal axis relative to the mounting arm.

7. An airflow baffle system, as in claim 1, wherein
the magnet is selectively fixable to the mounting arm in a plurality of locations along a length of mounting arm.

8. An airflow baffle system, as in claim 7, wherein:
the mounting arm has a slot along the length thereof, the magnet is connected to the mounting arm by an adjustable fastener directed through the slot, and by operation of the adjustable fastener the magnet is selectively movable and fixable to the mounting arm in any position along the slot.

9. An airflow baffle system, as in claim 8, wherein:
the mounting arm is connectable to the base in a plurality of positions along a width of the base, whereby the mounting arm can be located in a plurality of positions along a width of the equipment cabinet.

10. An airflow baffle system, as in claim 9, wherein:
the mounting arm is connected to the base by an adjustable fastener, and by operation of the adjustable fastener the mounting arm is selectively pivotal in a horizontal plane relative to the base and fixable in a plurality of angular orientations in the horizontal plane.

11. An airflow baffle system, as in claim 1, wherein:
the second angular orientation is vertical.

12. An airflow baffle system, as in claim 1, wherein:
the channel is aligned at a first angle with respect to a vertical direction;
the lower portion of the panel is aligned at a second angle with respect to the upper portion of the panel; and
a sum of the first and second angles being substantially one-hundred and eighty degrees.

13. An airflow baffle system, as in claim 1, further comprising:
the base having an adjustable riser operable to adjust a vertical position of the airflow diverter panel with respect to the top of the equipment cabinet.

14. An airflow baffle system, as in claim 13, wherein:
the riser has an upper portion and a lower portion;
the lower portion is operable to connect to the top of the equipment cabinet, the lower portion has the contact portion of the base, and the mounting arm and magnet are connected to the lower portion; and
the upper portion is selectively movable in a vertical direction relative to the lower portion and fixable relative to the lower portion to adjust a vertical position of the airflow diverter panel with respect to the top of the equipment cabinet.

15. An airflow baffle system, as in claim 14, wherein:
the base has a fixed-height portion and the riser is separable from the fixed-height portion of the base; and
the mounting arm and magnet are selectively connectable to the fixed-height portion of the base or to the riser.

16. An airflow baffle system, as in claim 15, further comprising:
means to move the upper portion of the riser relative to the lower portion; and
means to fix the upper portion of the riser relative to the lower portion.

17. An airflow baffle system as in claim 1, comprising:
a plurality of equipment cabinets arranged in a row in a data center; and
an airflow baffle as described in claim 1 mounted on each of the plurality of equipment cabinets an forming a substantially continuous airflow barrier along an length of the row.

18. An airflow baffle system as in claim 1, comprising:
in the first position, the airflow diverter panel extending from the base in a cantilevered fashion on one side of the contact portion of the base; and
the magnet being spaced from a second side of the contact portion of the base opposite the first side thereof such that the magnet is operable to provide a countervailing force opposite a fulcrum created by the contact portion, to balance a weight of the airflow diverter panel.

19. An airflow baffle system as in claim 18, comprising:
the base having a mounting flange coupled to the contact portion, the mounting flange being disposed on the second side of the contact portion at a height higher than the contact portion; and
the magnet being coupled to the mounting flange.

20. An airflow baffle system as in claim 1, wherein the size of the opening of the channel is substantially equal to a thickness of the airflow diverter panel.

* * * * *